(12) United States Patent
Ito

(10) Patent No.: US 10,805,431 B2
(45) Date of Patent: Oct. 13, 2020

(54) METHOD AND APPARATUS FOR REMOTE DATA MONITORING

(71) Applicant: TOKU INDUSTRY, Edmonton (CA)

(72) Inventor: Tokunosuke Ito, Edmonton (CA)

(73) Assignee: TOKU INDUSTRY INC., Calgary (CA)

( * ) Notice: Subject to any disclaimer, the term of this patent is extended or adjusted under 35 U.S.C. 154(b) by 320 days.

(21) Appl. No.: 15/718,766

(22) Filed: Sep. 28, 2017

(65) Prior Publication Data

US 2020/0045146 A1 Feb. 6, 2020

Related U.S. Application Data

(60) Provisional application No. 62/402,375, filed on Sep. 30, 2016.

(51) Int. Cl.
| | |
|---|---|
| *H04L 29/06* | (2006.01) |
| *H04L 29/08* | (2006.01) |
| *H04W 4/38* | (2018.01) |
| *H01L 31/0392* | (2006.01) |
| *G06F 1/3287* | (2019.01) |
| *G06K 19/06* | (2006.01) |
| *H01L 31/0224* | (2006.01) |
| *H04W 4/70* | (2018.01) |

(52) U.S. Cl.
CPC ............ *H04L 69/08* (2013.01); *G06F 1/3287* (2013.01); *G06K 19/06037* (2013.01); *H01L 31/022425* (2013.01); *H01L 31/03926* (2013.01); *H04L 67/125* (2013.01); *H04W 4/38* (2018.02); *H04W 4/70* (2018.02)

(58) Field of Classification Search
CPC ........ H04L 69/08; H04L 67/125; H04W 4/38; H04W 4/70; G06F 1/3287; G06K 19/06037; H01L 31/022425; H01L 31/03926
See application file for complete search history.

(56) References Cited

U.S. PATENT DOCUMENTS

| | | | |
|---|---|---|---|
| 7,684,904 B2* | 3/2010 | Wainwright | H04L 67/2823 701/3 |
| 7,778,262 B2* | 8/2010 | Beagley | H04W 4/18 370/401 |
| 9,788,183 B1* | 10/2017 | Fitzpatrick | H04W 4/90 |
| 2017/0289317 A1* | 10/2017 | Seemann | H04L 12/12 |

* cited by examiner

*Primary Examiner* — Elias Desta
(74) *Attorney, Agent, or Firm* — Parlee McLaws LLP (CGY); Chi Fai Andrew Lau

(57) ABSTRACT

A system, process, and apparatus are disclosed for use with remote sensors. A universal translator is disclosed that communicates with a sensor or related device. The universal translator stores data, converts data to a standardized form, transmits data to a cloud-based operating system, and receives updates and instructions from the cloud-based operating system. The cloud-based operating system allows remote sensor/universal translator pairs and remote users to interact in a variety of ways. A number of processes are performed by the universal translator, other processes are performed by the cloud-based operating system, and some processes are performed jointly by the universal translator and the cloud-based operating system. In addition, an application for smart phones, tablets, or the like is disclosed for use during the installation of a remote sensor and/or universal translator.

28 Claims, 11 Drawing Sheets

METHOD AND APPARATUS FOR REMOTE DATA MONITORING

Remote data monitoring systems employing one or more sensors are used in a number of different applications. For example, an oil or gas pipeline may have many sensors (e.g., temperature, pressure, flow rate) located at various locations along the pipeline. These sensors are typically monitored from one or more remote locations. Sea water temperature, salinity, and current are also sensed at many locations, but are typically monitored remotely. This simply means operators or observers who have access to the data generated by the sensors do not need to physically visit a sensor to obtain the data. Such remote sensing has been widely used for many years. The widespread use of the Internet has made such practices extremely pervasive across many industries.

The development of the "cloud" has increased the capabilities of remote sensing systems. The cloud is simply computing and memory capacity that is accessible to many users at many remote locations. Such users typically access this shared computing and memory capacity through the Internet or some other computer network system. Cloud systems also may be accessed via cellular network systems, satellite communication systems, or combinations of these and other systems.

Despite the widespread use of remote sensing systems that utilize the cloud and internetworked systems, there remain common limitations on such systems. Sensors come in many different configurations and there is a lack of standardization of mechanical, data, and communications configurations. This lack of standardization results in many sensors being effectively locked into an existing system, which may be a system designed and implemented many years ago. This can result in slow data response times and limited data transmission. It can also limit a particular sensor to operating as part of a particular system.

This can pose problems in many industries and areas of research which need access to as much data as possible. There is a great deal of potential data, but the shortcomings of present systems leave most operators unable to fully take advantage of the data. An operator, for example, may be forced to use a number of different systems to obtain data from different groups of sensors.

The present systems also fail to take full advantage of the potential data available at remote sensors. Take, for example, a powered sensor at a remote oil pumping station. If the pumping station loses power, the sensor may also lose power. But if the sensor is limited to sending a particular type of data (e.g. pressure or temperature), the power loss is likely to appear only as an error signal. An operator will not know the cause of the error signal. Yet the sensor "knows" that it has lost power. If that information could be transmitted to the operator, this relatively standard type of sensor would also become a rapid means of detecting a loss of power at the pumping station. Such data is potentially available at many sensors, but may not be available to operators due to the inherent limitations of the current technology.

In order to update a current system, technicians typically must visit every remote sensor and either replace the sensor or install new hardware to upgrade the sensor to a new standard. The new standard might provide substantial improvements over the former one, but the process of making such a change can be very time consuming and costly. Many remote sensors are located in locations that can be difficult and costly to access.

Expansion of the capabilities of current systems is also difficult. If an operator wants a new sensor installed, a technician typically must go to the site to install the sensor. Once the sensor is installed, the operating system must be updated to accept data from the new sensor. This process may take days to accomplish and can result in substantial delay before the new data is available.

There is a need for an improved method of obtaining and using data from remote sensors. The improved system should include a high degree of standardization and should allow operators the ability to modify or update remote sensors without any need for a technician to physically visit each sensor. A means is needed for communicating from a cloud-based operating system with remote sensors of various types. This system should allow for simple, rapid expansion. It should allow, for example, the implementation of a new communications protocol within the entire system without any need for technicians visiting each remote sensor. It also should allow for a greater flow of data from existing sensors, thus giving operators a richer set of data than currently exists.

SUMMARY OF THE PRESENT INVENTION

A primary objective of the present invention is to enable an end user to access data from a plurality of remotely-located sensors at any time, from any place and through any operating or communications protocol adopted by the user. This objective is achieved through the use of a cloud-based operating system that communicates with a universal translator module that is connected to the remote sensor. The unique characteristics of both the universal translator module and the method of communication and control between the module and the cloud-based operating system produce the key advantages of the current invention.

Another objective of the present invention is to allow key operating system features to operate at a cloud level, thus allowing many users access to the data, even if the users have different operating or communication systems. This objective is achieved in part by having any system-specific communication protocols internal to the cloud-based operating system. In other words, the present invention may employ unique or proprietary communication standards within the cloud-based operating system, the universal translator modules, and for communications between these key parts of the system. The invention, however, will employ an open-source or other universally available interface protocol (e.g., APIs) between the cloud-based operating system and users. Indeed, universally adopted APIs may be used at a number of points in the system, with different APIs used at different points. The current invention is able to operate within such an environment, while providing seamless connection between users and remote sensors, between users and potential vendors, and many other types of interactions. The invention may impose limits on the access and control of particular users depending on the specifications of the party or parties responsible for the remote sensor system.

It is yet another objective of the present invention to expand the types of data provided by existing remotely-located sensors. This objective may be achieved, for example, by having the universal translator configured to detect when power is lost and to transmit that data to the cloud-based operating system.

Another objective of the present invention is to allow for updates to the operating system of existing sensors (e.g., adopting a new communications protocol) without any need for a technician to visit the sensor. This objective may be achieved, for example, by the cloud-based operating system sending a specific command to the universal translators in a particular system to indicate that a new communication protocol is being adopted. The universal translators would recognize and authenticate this message and then allow the new protocol to replace the prior one. These steps can be accomplished without any visit to the remote sensors.

It is yet another objective of the present invention to allow for rapid and simple expansion of a remote sensing system by allowing an operator to identify a need for a new or different sensor at a particular location. The present invention allows for nearly instantaneous availability of the data from such a sensor upon installation, and may, depending on the nature of the sensor, allow for changes to a sensor's data output without any change to the physical sensor itself. The objective may also be met through automated processes, such that the invention actually anticipates the need for different data from a sensor and makes the needed change without waiting for a request from a user.

Another objective of the present invention is to preserve data at the sensor location to ensure critical data is preserved in the event communications with the sensor are lost. In a preferred embodiment, the present invention uses a hierarchical process for determining what data should be preserved based on a variety of real-time and real-world parameters.

In a preferred embodiment the present invention includes: a universal translator having a housing; a lower end cap connected to a first end of the housing and having a means for mechanically and electrically connecting the universal translator to a sensor, controller, or transmitter; and, a means for activating the universal translator; an upper end cap connected to a second end of the housing; a means for generating electrical energy located inside the housing; an electrical energy storage means located inside the housing and configured to receive electrical energy from the means for generating electrical energy; a means for wirelessly transmitting and receiving located inside the housing; electronics located inside the housing, wherein the electronics include a programmable processor configured to receive signals from a sensor, controller, or transmitter that is connected to the universal translator; to convert said signals into a standardized digital format; to store said signals in accordance with operational factors; to transmit said signals to a cloud-based operating system; and, to receive command and control signals from the cloud-based operating system.

In another preferred embodiment, the present invention includes a smartphone app having a code scanner configured to read a coded label on a universal translator; a processor configured to interpret the coded label so that the app recognizes the universal translator and the initial configuration of the universal translator; provide a user with a detailed set of instructions for initializing the universal translator; record certain identifying information about the universal translator and its installation; communicate wirelessly with the universal translator to perform systems checks and to coordinate the initialization of the universal translator; and, communicate wirelessly with a cloud-based operating system to complete the initialization of the universal translator.

In yet another preferred embodiment, the invention includes a cloud-based operating system for remote data management, having: data storage with the capacity to store data gathered from remote sensors; means for communicating wirelessly with a plurality of universal translators; means for communicating with a plurality of end users through a plurality of end user platforms; a processor to coordinate all operations of the cloud-based system, wherein the processor is configured to provide data from remote sensors to the plurality of end users and to perform the following steps for each universal translator: to communicate wirelessly with the universal translator to initialize the universal translator, including overseeing a systems check of the universal translator and updating the operating system of the universal translator during the initialization process, if needed; to receive standardized digital data signals wirelessly from the universal translator; to store such data signals in cloud-based data storage; to perform analysis of such data signals as directed by end users or preprogrammed software; to transmit command and control signals to the universal translator periodically to ensure the universal translator and its connected sensor, controller, or transmitter are operating properly and to coordinate repairs in the event of a malfunction; and, to transmit data from the universal translator to an end user.

DETAILED DESCRIPTION OF THE DRAWINGS

Figure 1:
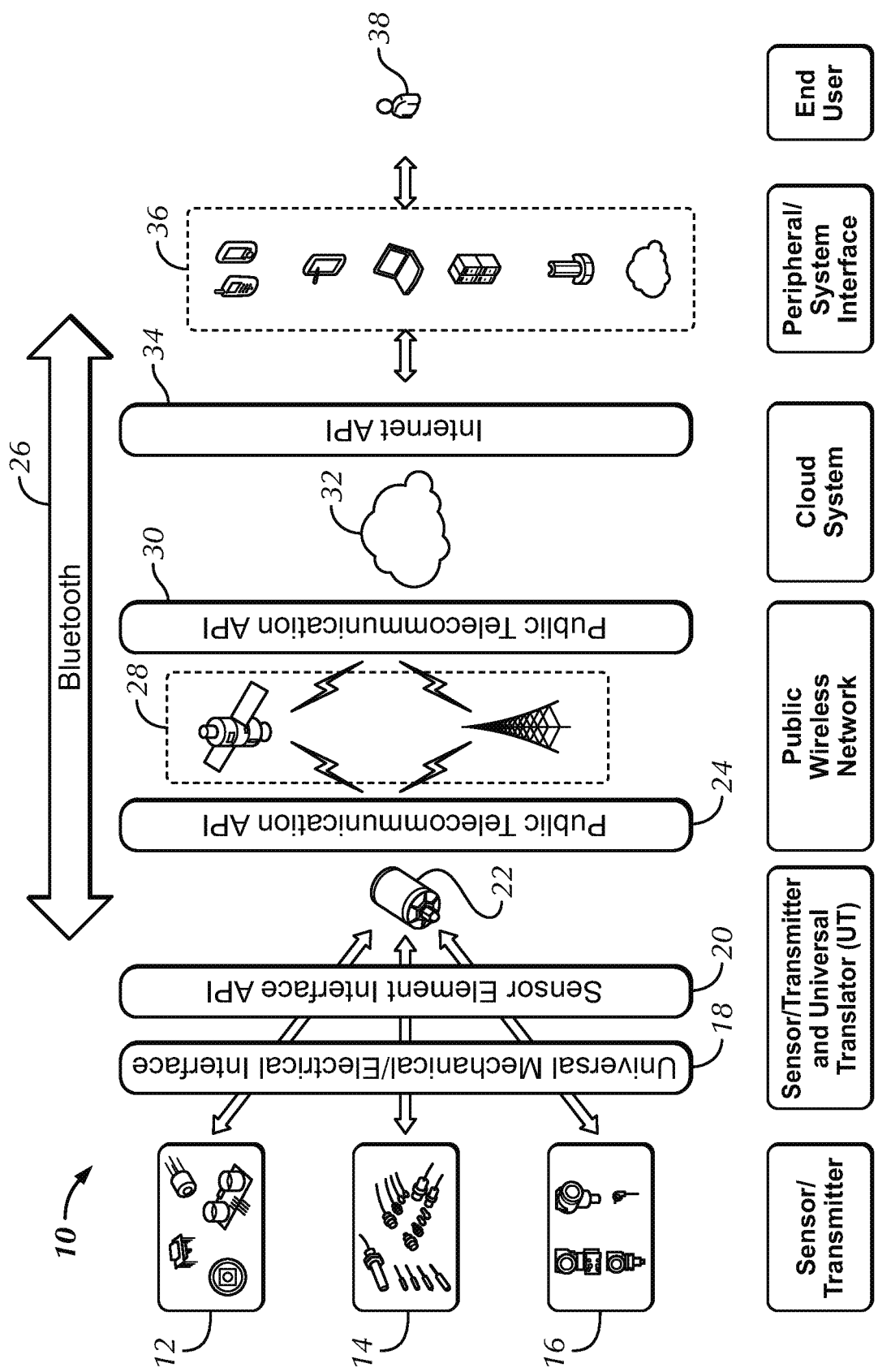
FIG. 1 is a block diagram showing key elements of the invention.

A remote data monitoring system 10 is shown in FIG. 1 in block diagram form. This system includes a number of components such as sensors, universal translators, cloud-based storage and computing, and transmission processes to allow the various components to "speak" to each other. Certain communications protocols and standards are used with the invention, but the particular standards may vary from one industry to another. The invention is the system and certain of the key components of the system.

To understand the invention, it is helpful to walk through the components shown in FIG. 1. A sensor installed in a remote location obtains certain data, or needs to perform a particular task. A digital, integrated circuit sensor 12 might be used. An example of such a sensor might be an ultrasonic sensor to detect movement or density of a fluid or a digital temperature sensor. These types of sensors are common and are represented generally by item 12 in FIG. 1.

A more traditional elemental sensor may also be used. Such sensors are generally represented by item 14 in FIG. 1. Examples could include diaphragm-type pressure sensors or analog temperature sensors. Analog flow rate sensors might also be used. There is no intended limit to the type of sensors that might be used with the present invention, because the invention allows for incorporation of virtually any sensor into a standardized system.

The final type of input device shown in FIG. 1 is a process automation transmitter or controller 16. A remotely operated valve would be one example of such a device. A remote switch used to activate a heating element is another example of such a component. These devices could include data sensing or merely provide for monitoring or control of the status of a remote component. Valve position indicators are another example of this type of component. In a more complex system, an automatically operated valve might include a temperature sensor, such that the valve is configured to open or close when certain temperature set points are reached. The present invention can interface with any of these types of components and allow such components to be easily and quickly incorporated into a standardized system.

The next important component shown in FIG. 1 is the universal translator (UT) 22, which is merely a name assigned to this key component. There is a mechanical/electrical connection 18 between the sensor and the UT 22. There may also be an API (application protocol interface) 20 used with the communications between the UT 22 and the sensor. In a preferred embodiment, an API 20 is used at this interface, but it is not necessary. It is possible to hardwire the sensor-UT connection so that the sensor data is available to the UT 22 without the use of a standardized interface protocol. This arrangement is less preferred, but will work so long as the sensor data is converted to an appropriate format by the UT 22.

A primary function of the UT 22 is to convert any type of sensor data into a form that can be transmitted to and utilized by a cloud-based storage and computing system 32. The UT 22 is a smart device capable of substantial computing, data storage, and data conversion. The operations of the UT 22 are described in more detail below, but this key component of the invention allows for virtually any type of sensor or automation transmitter/controller to be monitored or controlled remotely through use of a cloud-based storage and computing system 32. The UT 22 may communicate with other devices via Bluetooth 26 or the public telecommunications system 24 (via cellular or satellite 28). The UT 22 and the cloud-based systems 32 utilize the public telecommunications APIs 24, 30 for communications. These APIs are shown twice in FIG. 1, because the invention might first have the UT 22 transmit a cellular signal, for example, to a cellular tower using the cellular transmission API 24, while the cellular tower may communicate with the cloud 32 using an appropriate API 30.

Data from the sensor will be stored in the cloud 32. The data is also communicated to an end user 38 from the cloud 32 via the Internet API 34. The end user 38 may use any one of a variety of platforms 36, such as a computer, smartphone, tablet, etc. to interface with the cloud 32. This is a two-way communication, as the end user 38 has substantial control through use of the present invention. Indeed, communications are two-way throughout much of the system of the present invention.

The UT 22 of the present invention provides a number of important advantages over the prior art. Remote sensors have been used for many years. Some of these remote sensors transmit data wirelessly. But these components typically are relatively large, complex, and somewhat difficult to install, maintain, or replace. For example, a typical prior art remote sensor/transmitter includes physically separate sensor and transmitter components, with cables connecting each component. Prior art transmitters typically require a separate power source. These prior art systems typically transmit only the data obtained by the sensor. The prior art systems were not "smart" systems, but are merely remote sensors coupled with remote transmitters.

Figure 2A:
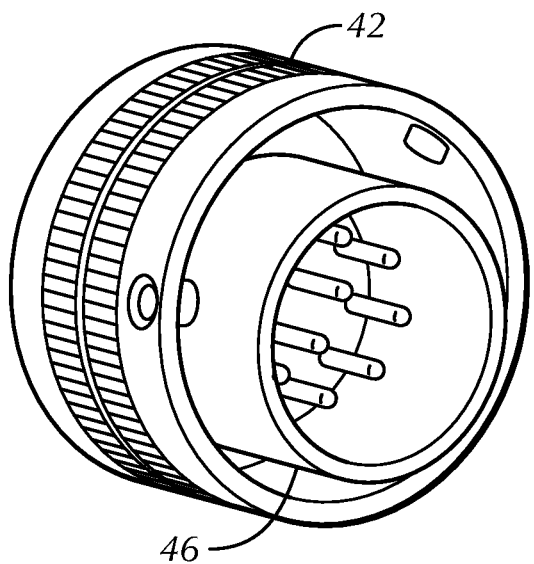
FIGS. 2A and 2B are perspective views of a typical male and female part, respectively, of a mechanical/electrical connection that may be used with the invention.
Figure 2B:
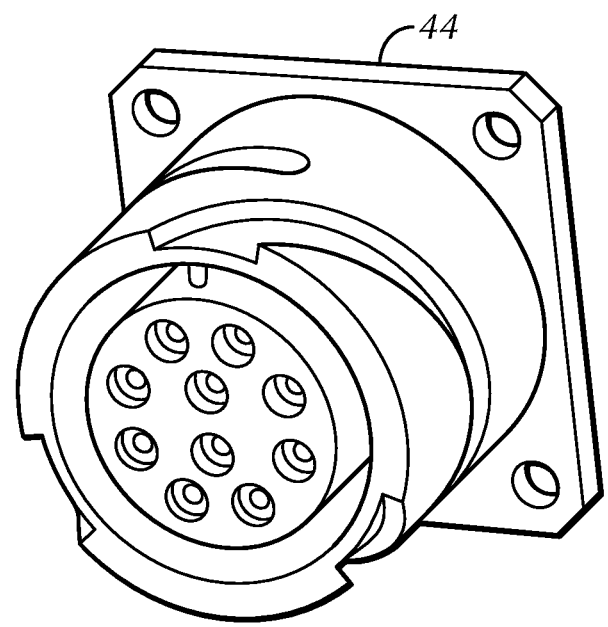

The UT 22 is a smart component that is connected directly to the sensor. In a preferred embodiment, this connection is made using a standardized type of connector. One example of such a connector is shown in FIG. 2, which shows the male connector 42 and the female connector 44. This connector has multiple pins 46, which can be used for a variety of functions. A pair of pins may provide power connections (e.g., positive and ground). Other pins may provide analog sensor data. Other pins may provide for other communications or control between the UT 22 and the sensor or controller. In one embodiment, a 10-pin connector is used, with two pins for power, four pins for digital signals, and the four remaining pins for analog signals. Through the use of a multi-pin connector like the one shown in FIG. 2, the UT 22 can do much more than just obtain and transmit the data from the sensor.

The UT 22 also may be connected to a sensor via a single pin connector. In that configuration, the pin would carry both power and the data signal. The body of the connector would be the ground.

The UT 22 can monitor the status of the sensor and can detect a loss of power to the sensor. If the sensor is powered by the same system that operates critical remote equipment (e.g., pumps), then the UT may be able to detect a power loss and provide that information to an end user almost instantaneously. The UT 22 also may be programmed to operate differently if the power is lost to the sensor.

The UT 22 is also capable of continuously monitoring the status of its communications link with the cloud 32. If that link is lost, the UT 22 can shift to a data-storage mode to preserve as much sensor data as possible until the communications link is reestablished. The UT 22 can be configured to prioritize sensor data so that the most critical data is preserved. Data compression processes also may be utilized by the UT 22 if the circumstances warrant. These are some examples of the smart capabilities of the UT 22 that are not found in typical prior art systems.

The UT 22 also provides important advantages in installation and connectivity. Typical prior art sensors and transmitters require an experienced technician to handle installation. For example, the sensor and transmitter are typically separate components and require separate installation and connection. The transmitter is not a two-way or smart device, and therefore, once installed, the operator must return to a location where there is Internet service to determine if the components are working as intended. Various IT operations may be needed, because there is a lack of standardization from one transmitter to another. As a result, it often takes a few days to complete the installation or repair of a remote sensor/transmitter. The end user may be without any data from the sensor until this process is complete. An installer must have expertise in the sensor design, the transmitter design, and IT in order to ensure the install will be a success.

The UT 22 of the present invention provides a radical departure from the prior art. Assume for example, an existing pressure sensor needs to be replaced with a sensor having a broader measurement range. With the present invention, the process begins with the new sensor being paired with the UT 22. The UT 22 is configured to work with the particular sensor and is paired with the cloud-based system 32. All of this happens in minutes and before the components go into the field. At this point, the cloud 32 "knows" the UT/sensor combination by a unique identifier stored in the cloud 32. The system, therefore, is ready to receive data from the new UT/sensor combination before these components are sent to the field for installation.

The UT 22 may also be configured to work with an existing sensor. This may be accomplished by pre-programming the UT 22 to work with the existing sensor. For example, if a digital pressure sensor in the field is to be retrofitted with a UT 22, then the UT 22 could be programmed to receive and process the type of data generated by this particular digital pressure sensor. The UT 22 also could be paired with the cloud-based system, which could include information on the sensor and its location. In this way, when the UT 22 is connected to the pressure sensor in the field, only a few steps are needed to get the UT/sensor combination up and working.

Continuing with the example from above, an operator may take a preprogrammed and paired UT/sensor combination into the field. The existing sensor is isolated and removed. The new UT/sensor combination is installed. The operator may use a smartphone app (or an equivalent portable electronic device capable of wireless communication with the UT 22) to communicate with the UT 22. In a preferred embodiment, a typical smartphone performs these functions and communicates with the UT 22 via Bluetooth. The smartphone will read a QR code (or some comparable coded label) on the UT 22, and that will provide the unique identifier of the UT 22 and any other key data (e.g., the current operating system of the UT 22, the sensor type and range, etc.).

A smartphone app is used in a preferred embodiment because such an app is relatively easy to create and may be used by operators without requiring extensive training. Such an app should include clear instructions to the user, and many sets of instructions could be available using the app. A simple flow-chart style interface might be used on the app to allow a user to select the instructions needed. The specific process used by the app is not critical to the invention, so long as the app facilitates and guides the operator through the install process.

An example is helpful. Assume a smartphone app in accordance with the present invention is used in connection with the replacement of a prior art pressure sensor and transmitter. The app may ask the operator to enter information about the system. For example, the operator might be presented with a list of options like oil and gas production; oil or gas pipeline; industrial chemical processing; and so on. The operator may select one, such as oil and gas production. A second-level set of options might then appear, that would allow the operator to further identify the system. This process might lead to information specific to the particular system, including instructions for the isolation and replacement of the particular sensor the operator was sent to replace. Such instructions could then be provided to the user via the smartphone app, with safety protocols built in. For example, the app may require the user to confirm that the isolation valve has been shut before the instructions for removing the sensor are provided.

Alternatively, when the UT 22 or the UT/sensor combination are preconfigured (i.e., in a lab or shop before going to the field), the details of the particular field installation might be loaded onto the cloud, complete with all installation instructions. Those instructions could then be accessed via the smartphone app when the smartphone reads the QR code (or alternative identifier code) on the UT 22 in the field. That is, the smartphone app could use the QR code to access the specific instructions from the cloud.

Whether the smartphone app has the install and initialization data stored on the smartphone or receives that data from the cloud, the app would use that data to guide the operator through the process. A means for activating the UT 22 is provided (i.e., in a preferred embodiment, this means is a single, weather-proof pressure button on a lower end of the UT 22). Pressing this button causes the UT 22 to communicate with the smartphone. The smartphone app would use the identifier data received from the UT 22 to present the operator with the appropriate instructions for completing the installation.

The smartphone app will link the most accurate geographic location data (via GPS, cell tower location, etc.) with the UT/sensor unit and store that data. The operator then takes a photo of the installation, which is also stored on the smartphone. This data is then transferred to the cloud 32 by the smartphone. These steps take only a few minutes and result in the cloud 32 knowing the sensor type, the geographic location, and the unique identifier of the UT 22. The cloud 32 also has a photo of the install that is linked to the specific UT/sensor combination. Because the cloud 32 was pre-paired with this UT/sensor combination, the cloud system 32 is already prepared to receive data.

Upon completion of these install steps, the cloud system 32 will initiate a series of checks to ensure the UT 22 has the most current operating system. If an update is needed, the cloud system 32 will send a signal to the UT 22 that will place the UT 22 into the proper mode to update its operating software. Once such an update is complete, the cloud system 32 will check to ensure the UT 22 is operating correctly, and data transmission will begin. These steps are performed quickly and confirmation of them is provided to the installer via the smartphone app. The entire installation process typically takes less than an hour (and can be done in only a few minutes if the operator has a good connection to the cloud during the install), and once complete, data is available to the end user.

The status of this process may be indicated on the smartphone app. Once the initialization process is completed and the UT/sensor combination is transmitting data to the cloud, the smartphone app will notify the operator that the installation and initialization are complete. The operator may then either return from the field or proceed with the installation of additional UT/sensor units. Using the present invention, a single operator could install many such units in a single day.

The UT/sensor combination of the present invention provides expanded capabilities to end users through the cloud-based system 32. Assume, for example, that the pressure sensor discussed in the prior paragraphs is configured to transmit pressure data every 30 seconds. In a prior art system, that type of parameter is typically set at the remote transmitter, and to change it, an operator may have to go to the remote transmitter and manually change the data sampling frequency. The UT 22 of the present invention allows an end user to make such a change quickly and easily (subject, of course, to controls imposed by the owner/operator of the system).

For example, the end user may need pressure data every 5 seconds. This change is transmitted from the end user 38 to the cloud system 32 which sends an instruction to the UT 22 to increase data transmission to every 5 seconds. The change is made. In addition, the UT 22 can be programmed to perform other operations based on sensor data. Perhaps pressure data is more important when pressure is within a certain range. The UT 22 can be programmed to automatically increase the data transmission frequency when pressure reaches a certain set point. These capabilities are all due to the smart capabilities of the UT.

The interface between the UT and the cloud also offer important advantages. Continuing with the prior example of a newly installed pressure sensor, assume there is a remotely operated pressure relief valve in the system. The end user may define a set point for partial opening of this valve when pressure at the sensor reaches that set point. The cloud can automate the entire process. When the UT connected to the pressure sensor reaches the set point, the UT can send an additional signal (e.g., a signal to open the relief valve one turn) to the cloud. The cloud could then send a signal to the UT connected to the relief valve operator with the instruction to open the valve one turn. As pressure drops, the system could function automatically (and very quickly) to close the relief valve in order to maintain pressure within a desired range.

The UT 22 is self-powered, as will be explained more below. This provides a high degree of reliability, and it allows the UT to continue to obtain and store data even if the connection to the cloud is lost or if power is lost to other parts of the remote system. The UT's power system may also be used to power the sensor, thus ensuring that key sensor data is not lost. When the UT detects a loss of power to the rest of the system (e.g., to a remote oil or gas well site), the UT can transmit that information to the cloud 32 and thus to end users 38. If the link to the cloud 32 is lost, the UT can shift to data conservation mode, saving as much data from the sensor as possible in order to eliminate or reduce the amount of data lost due to a loss of communications between the remote sensor and the cloud.

Figure 3:
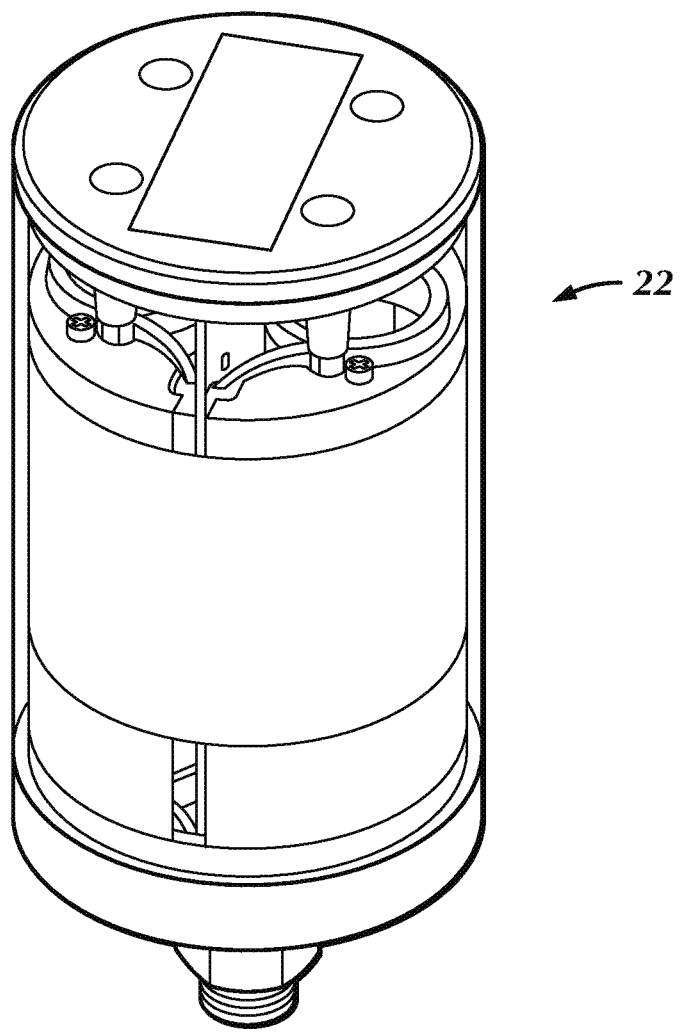
FIG. 3 is a perspective view of a preferred embodiment of a universal translator.
Figure 4:
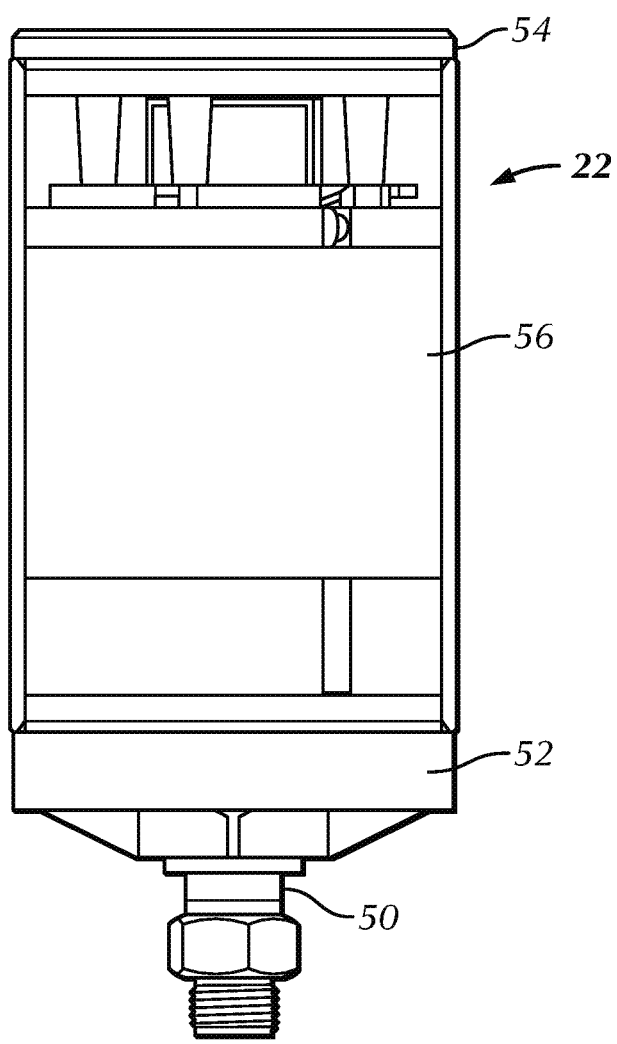
FIG. 4 is a side view of a universal translator.
Figure 5:
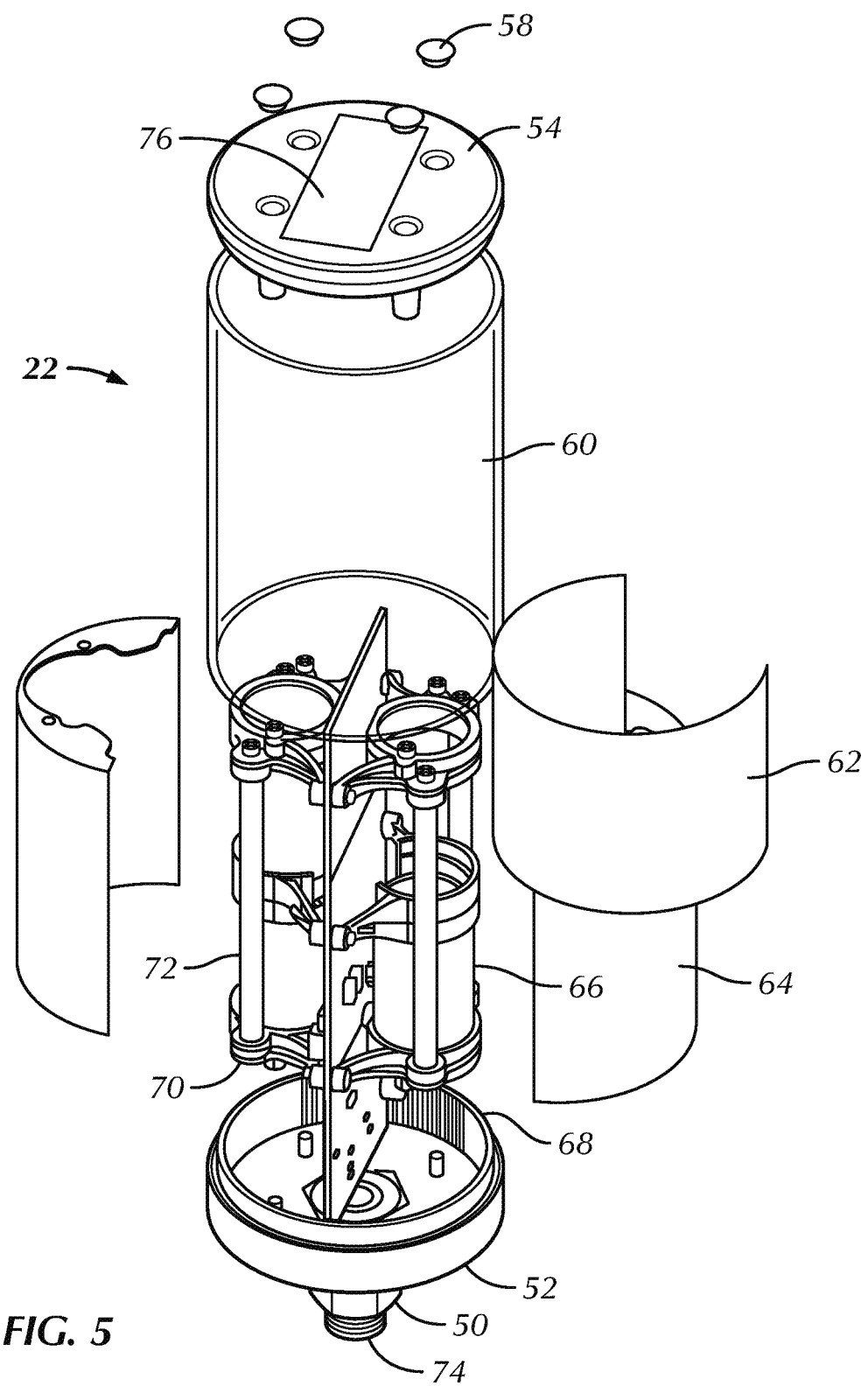
FIG. 5 is an exploded view of a universal translator, showing key components of this device.

FIGS. 3-5 show the UT 22 in perspective, side, and exploded-parts views. Referring to FIG. 4, the sensor 50 is shown directly integrated into the lower end of the UT 22. This embodiment does not use a standardized mechanical/electrical connector like the one shown in FIG. 2. The lower end cap 52 and upper end cap 54 can be seen in FIG. 4. The end caps are identified as "lower" and "upper" merely for convenience. In the figures, the UT 22 is shown in a generally vertical position, with one end cap at the bottom or lower end and the other at the upper end. The lower end is used here to refer to the end of the housing that is connected to the sensor, controller, or transmitter. The upper end refers to the opposite end of the housing.

It should be understood that a UT/sensor combination may be installed in any position, and as a result, when installed, the lower end cap 52 will not always be vertically lower than the upper end cap 54. Indeed, if the UT/sensor combination is installed horizontally, the two end caps would be at the same vertical position. To be clear, the lower end cap 52 is a reference to the end cap that will positioned near or on the sensor, controller, or transmitter to which the UT 22 is connected.

Similarly, references to the sensor, controller, or transmitter being connected to the lower end cap 52 shall include any type of connection between the UT 22 and a sensor, controller, or transmitter. For example, a standardized connector might be physically connected to the lower end cap 52 or it might extend through the lower end cap 52 without any direct or structural connection to the end cap. Alternatively, a sensor might be connected directly to components within the UT 22 housing through an opening in the lower end cap 52. All of these configurations, and any others that result in a connection between the UT 22 and a sensor, controller, or transmitter at the "lower" end of the UT are means for connecting the UT 22 to a sensor, controller, or transmitter at the lower end cap 52. These terms are limiting only to the extent that the UT/sensor connection is located at or near the lower end cap 52 and not at or near the upper end cap 54.

The UT housing 56 is also shown, and may be a single piece or may consist of different materials. The housing 56 should be durable enough to withstand extreme weather conditions while protecting the internal parts of the UT 22.

The sensor 50 is connected to the UT 22 at the lower end cap 52. The connection may be made directly to the internal UT 22 components through an opening in the lower end cap 52, or a standardized mechanical/electrical connector may be used. In the latter configuration, the standardized connector would extend outward, along a longitudinal axis, from the housing 56 and the lower end cap 52.

Several of the key parts of a typical UT 22 are shown in FIG. 5. The sensor 50, lower end cap 52, and upper end cap 54 are shown as they were in FIG. 4. Weather-resistant caps or plugs 58 are shown on the upper end cap 54. These are used to prevent water from getting inside the UT 22. A transparent (or at least translucent) outer shell 60 surrounds much of the body of the UT 22. The UT is cylindrical in shape, and the outer shell 60, therefore, can be made of a thin sheet of material. A solar cell 62 is positioned inside the outer shell 60, which explains why the shell 60 is transparent (or at least translucent). The shell 60 should block as little sunlight as possible in order to ensure the solar cell 62 receives the maximum energy from the sun. A support shroud 64 for the solar cell 62 is used to provide structural strength and support to the cell. This configuration ensures that the solar cell 62 remains flat—that is, the cell 62 in this embodiment is held in place between the outer shell 60 and the support shroud 64. In a preferred embodiment, the solar cell 62 wraps completely around the UT in order to absorb solar energy from every possible direction.

A thin film solar cell like the one shown in FIG. 5 is a preferred means for generating electrical energy, but other generating means may also be used. The electrical energy generation is located inside the housing (as shown in FIG. 5) in order to minimize the connections to external components and simplify installation. The invention may, however, include a plug and other power connection to allow the UT to receive power from an external source. This arrangement might be preferred when the UT/sensor combination is installed in a location with a ready source of electrical power. In this configuration, the internal means for generating electrical energy could serve as a back-up power source, thus increasing the UT's operating conditions (i.e., having an external power source would allow the UT to operate normally even if there is no sunlight for days or weeks at a time).

The internal means for generating electrical energy might be other types of solar cells (i.e., other than the thin film cell shown in FIG. 5). For example, one of the end caps might contain a solar cell just beneath a protective film or cover. As long as there is some type of protective coating on the cell, it is considered an internal means for generating electrical energy. It may also be possible to utilize wind energy (e.g., with a small internal turbine and wind routed through ducts into the housing), geothermal (e.g., by routing steam from a geothermal source to a in small internal turbine), or an electro-chemical process other than a photovoltaic cell. Any of these would constitute a means for generating electrical energy located inside the housing.

Batteries 66 (or other electrical energy storage means) are provided to store electrical energy generated by the solar cell 62. Other electrical energy storage means might include capacitors or an inductive/capacitive circuit. Any type of battery is acceptable, but specific battery types may be more desirable in particular conditions. For example, a gel cell, lead-acid battery performs well in cold conditions (down to at least −40 C). Lithium-ion batteries are lighter than lead-acid and have good performance in less extreme temperatures. Lithium-ion type batteries, therefore, may be preferred in some circumstances. Electronics 68, which may include a microprocessor, memory, and other components, are positioned near the center of the UT 22. This is intended to help protect these components from heat and cold and other stresses. Battery supports 70 and housing supports 72 provide general structural support to the UT 22 and to the batteries 66 and electronics 68, in particular. An identification plate 76 is shown on the upper end cap 54, and typically would include a QR code or other type of code that can be read by a smartphone or similar device. An activation button is not visible in these figures because it is typically placed on the lower end cap 52. The activation button is used to initiate communications between the UT 22 and either the smartphone (or equivalent device) being used to install the UT or the cloud 32 (likely via a cellular network). This button is positioned on the lower end cap 52 in a preferred embodiment to reduce the risk of inadvertently pressing the button, which might interrupt operations and reinitialize the UT/sensor combination.

In a preferred embodiment, the UT 22 has all key components within its housing. This configuration is shown in FIGS. 3-5. The UT 22, however, may also receive power from an external source. Indeed, when external power is available, the solar cell arrangement described above may operate primarily as a back-up power supply, or may be omitted entirely (the latter is not preferred because the solar cell configuration provides more reliable operations).

Similarly, the UT 22 in a preferred embodiment contains the needed internal antenna(s) for all transmissions. It is, however, possible to provide a connection on the UT for an external antenna, in the event such an antenna is available. This might enhance the UT's ability to communicate via Wi-Fi, cellular, satellite, or other wireless means. Indeed, the UT of the invention is not limited in the wireless communications means, and the use of a larger, external antenna might be highly beneficial for some types of communications (e.g., radio waves). It is preferred, however, to include an internal means for wirelessly transmitting and receiving signals, and that would include both the antenna(s) and the electronics needed to generate or receive signals. The UT could communicate via wired connections when the circumstances permit such a configuration (e.g., Ethernet connection or coaxial cable), though it is expected that such an arrangement would be rare, given the remote location of most UT/sensor combinations.

The UT 22 of the present invention may be packaged in a relatively small unit. In one embodiment of the invention, the UT 22 has an outer diameter of approximately four inches and a total length of approximately seven inches. The UT 22 also may be an Intrinsically Safe (IS) rated component.

The UT 22 may be designed to work with many types of sensors or controllers. In one embodiment, the UT 22 is preconfigured for at least 32 different sensor types. For digital sensors, it is possible to preconfigure the UT 22 for hundreds of different sensor types or models. Because certain types of sensors are common in certain industries, a selection of the 32 most common provides a UT 22 that will recognize most sensors within a given industry. In a preferred embodiment, the UT 22 provides power to the sensor upon connection, and the UT 22 detects the sensor type. This causes the UT 22 to use the proper program functions for the particular sensor type. The UT 22 may use preprogrammed settings for the sensor (e.g., if it is an analog sensor) or may communicate two ways with the sensor to configure the UT. As a result, the UT will know the type of data, the frequency of data signals, the size of each data sample, and so on.

In preferred embodiments, the electronics 68 include an analog-to-digital converter (ADC) to convert analog sensor signals to digital signals. A 16 bit or higher ADC is preferred, in order provide high resolution of the signals. With a 16 bit ADC, the UT can provide over 65,000 digital data points from the sensor output.

The electronics 68 also includes a processor and other components capable of converting digital sensor signals into a standardized format for transmission to the cloud-based system. As described elsewhere, the UT is a "smart" device and can perform a variety of operations. These operations are controlled by a processor, which is part of the electronics 68. The processor, for example, controls the data storage and transmission operations and modifies those operations as operational factors warrant (e.g., prioritizing the data stored during prolonged periods without data transmission to the cloud-based system or using a random scatter-based transmission protocol when there is high transmission traffic density). The processor may be preprogrammed with many of these operational features, and it may also be reprogrammed through the cloud-based system after the UT 22 is installed in the field.

Figure 6A:
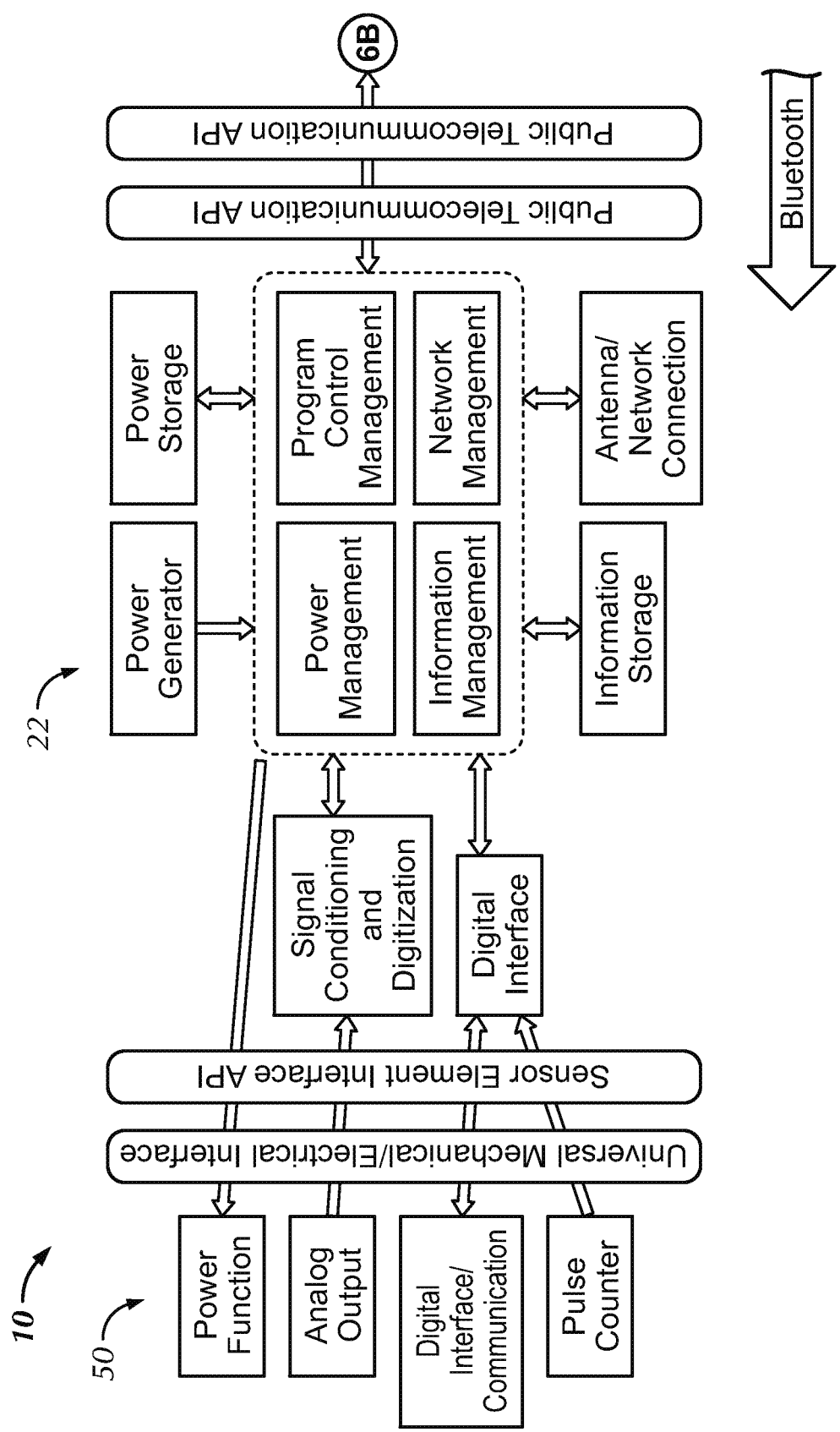
FIGS. 6A and 6B are functional block diagrams showing certain components and operations of the invention.
Figure 6B:
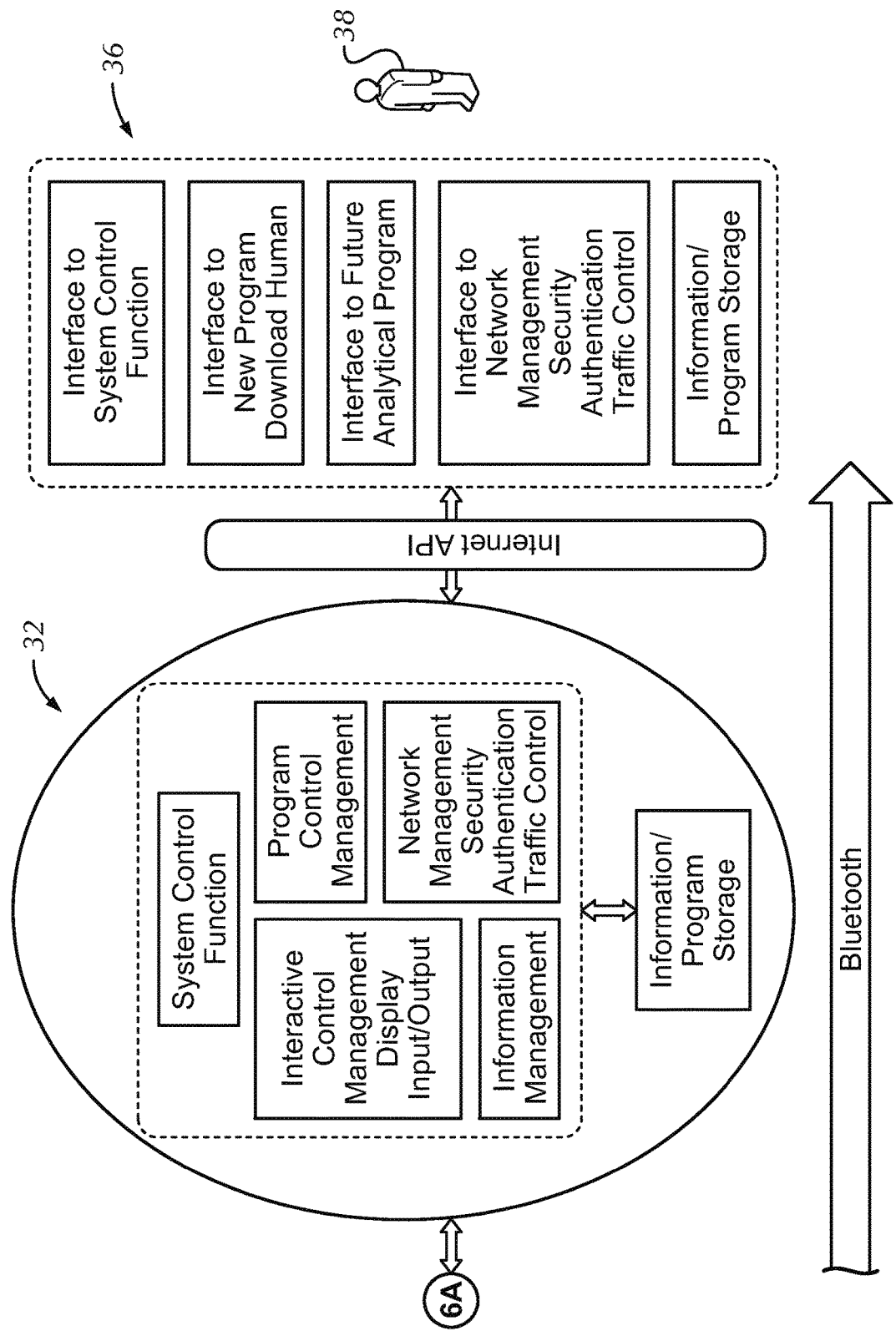

FIG. 6 is another functional block diagram. In this diagram, some of the key communication and control operations of the invention are illustrated. Looking, for example, at the sensor-to-UT interface, we can see a number of types of operations. First, the sensor 50 may be powered by the UT 22, as described above. This is not required, but it is possible with the present invention, and such an arrangement might provide more reliability. Because power is likely provided only from the UT 22 to the sensor 50, the arrow for this function points only in one direction (i.e., toward the sensor 50).

Two other possible operations of the sensor flow only in the opposite direction. An analog sensor will provide data to the UT, but there probably will not be any two-way communications with such a sensor. This may not always be true, because the UT might be able to monitor even analog sensors for certain operating conditions (e.g., continuity). But in general, with an analog sensor, the data will flow from the sensor to the UT. If the sensor includes a pulse counter, the count data is also likely to flow only from the sensor to the UT.

If a digital sensor is used, or if the UT is connected to an automated controller (e.g., a remotely-operated valve), there probably will be two-way communications between the sensor or controller and the UT. With a digital sensor, there may be a controller (i.e., microprocessor) within the sensor that can alter what data is sent, how often it is sent, and so on. The UT would communicate with such a sensor to ensure that the type of data needed by users is obtained. Similarly, if the UT is connected to a remote valve controller, there would probably be two-way communications. For example, the controller would communicate its status to the UT (e.g., ½ turn open) and the UT would send operating instructions to the controller (e.g., open the valve to 2 full turns).

Regardless of whether the communications between the sensor 50 and the UT 22 are one-way or two-way, there must be a connection between these components. This is shown in FIG. 6 as a universal mechanical/electrical interface, and could be the type of connector shown in FIG. 2 or some other standardized connector. As explained above, the UT-to-sensor connection need not use such a universal interface and can instead be connected directly into a unitary component, as was shown in FIGS. 3-5. FIG. 6 also shows an API between the sensor 50 and UT 22. This type of standardized interface protocol is highly desirable in the present invention, because it would allow a basic UT 22 to be connected to any type of sensor 50 that has the standardized connectors and that uses the standard API. In time, it is hoped that most sensors will adopt this type of standardization, as that would tend to maximize the benefits of the present invention. As the invention is adopted, however, it is expected that many installations will be more like the configuration shown in FIGS. 3-5, which provide the connectivity required, but do not use a universal connector or a standard API for the sensor-to-UT interface.

FIG. 6 shows a number of basic operations of the UT 22. Analog sensor data is conditioned and digitized by the UT 22 so that it can be stored and transmitted in a standardized digital form. Similarly, digital sensor data, pulse count data, or digital data from an automated controller are also standardized by the UT 22. This is a critical operation, because of the lack of standards for digital sensor data. Different sensors may produce different types of digital signals. The UT 22 is designed to work with all types of sensors, which means the UT 22 must be able to recognize all types of analog and digital sensor data. The UT 22 is programmed to convert all of these forms of data into a single, standardized format. It is this standardized digital data that leaves the UT 22. In this way, every remote UT/sensor combination will transmit data in accordance with a single protocol. This is a huge advance over the prior art, which may result in many different types of data at the cloud-level for a single operating system. A cloud-based operating system can make the necessary conversions of such varied data types, but this adds to the processing required and may slow the system. Most standardization is performed at the UT level with the present invention, which means data received by the cloud is already in a single standard format. This simplifies the cloud-based operations.

It must be noted that different industries and different operators may elect to use different data standards. The present invention is fully compatible with such differences. For example, if the oil and gas industry use a particular data standard, the present invention can configure UTs to produce data in compliance with the oil and gas industry standard. If, on the other hand, sea condition systems (i.e., those systems that monitor sea level, sea temperature, currents, salinity, etc.) use a different data standard, the present invention can provide UTs configured to generate data that complies with that standard. It is hoped that various industries will move toward fewer different data standards, and the present invention may help encourage parties to make such a move. But the key here is that the present invention achieves the needed standardization at the remote sensor level.

The UT 22 shown functionally in FIG. 6 has power generation (e.g., via solar cell, as described above) and power storage. It also has memory, which will store both information (i.e., data) and equipment identifiers (e.g., unique identifiers of the UT, the sensor type and model, geographic location, install date, antenna and transmitter design, etc.). Within the electronics of the UT 22, there are power management functions, program control management functions, information management functions, and network management functions. These internal UT functions are best understood by presenting some operating examples.

Assume a UT/sensor combination with a pressure sensor at a key point in a remote producing oil well. The UT may be programmed to monitor its power generation rate and its power storage levels to ensure there is no lapse in data storage or transmission. During the winter, there will be much less solar energy in some regions, and this will result in less power available to the UT. To address this issue, the UT may reduce the transmission frequency when some combination of low power generation rates and low power storage occur. For example, if power generation rates at 10 am are less than 50% of nominal full-power levels and if power storage is at less than 50% of rated capacity, the UT may shift to a power-preservation mode, which might reduce data transmissions to one-half the normal frequency.

The UT operating in the mode described in the preceding paragraph could also increase its data storage rate, to ensure that as much data as possible is retained. When power generation and storage levels return to an acceptable level, the UT could increase transmission rates and might begin to transmit the stored data. This is only one example of the many types of operations that can be internalized at the UT level.

Similarly, if the UT detects that its communication link with the cloud has been lost, the UT may increase its data storage so that as much data as possible remains available when communications are reestablished. The UT might also have a communication link process that allows it to seek alternative means of transmitting data if its primary link is lost. For example, if the UT typically transmits data via the cellular system, if that link is lost, the UT might attempt satellite communications. In some operating environments, the UT might be within Bluetooth range of a device with a hard-wired connection to the cloud, and that might provide a third possible means for the UT to communicate with the cloud. The ability to seek alternative communication pathways is an important benefit of the UT of the present invention.

The UT also may be programmed to coordinate data transfers with the cloud to ensure efficient operations during high traffic periods. If there is a high density of wireless traffic, the cloud or the UT may detect this fact and initiate a coordinated data transfer process. Rather than transmitting data, for example, every five seconds, the UT may shift to an hourly data transmission, but might send a full hour's data in compressed form to the cloud, thus reducing the burden placed on a heavy traffic situation. Indeed, in a preferred embodiment, communications between the UT and cloud are both compressed and encrypted (e.g., with 128 bit encryption).

The UT may use time-phased scatter as a back-up process when it detects a high traffic situation. The UT may use a random number generator and then delay data transmission based on the output generated. For example, the generator might indicate a delay of any duration between a few seconds and several minutes. Each successive operation would be delayed by a random period of time from the previous transmission, thus scattering the transmissions randomly and increasing the chances of finding an opening in an otherwise heavy traffic pattern. The cloud-based system might also implement a time based scatter process.

The UT and cloud may operate cooperatively to detect transmission problems. For example, a UT may detect problems in communicating via a cell tower (e.g., where that is the UT's primary communication means). The UT may be programmed to use an alternate communication means (e.g., satellite), but might also send a message to the cloud that the cell tower is down or has too much traffic. This can alert users, via the cloud, who may be able to take steps to correct the problem with the cell tower.

Multiple UTs may communicate primarily through a single cell tower. This may be common in some remote locations. If the cloud loses signals from all the UTs that use a particular cell tower, the cloud may be programmed to recognize this as a likely cell tower problem. This information could be provided to end users. In these ways, the current invention may also enhance users' ability to monitor the status of primary communications systems.

It is possible that some UTs will be used within Bluetooth range of an end user's operating platform. If this occurs, the UT could communicate directly with the end user's platform by Bluetooth, and the UT's data could then be sent from the end user's platform to the cloud. All of these types of operations can be programmed into the UT of the present invention.

When the UT is operating in a reduced power mode, it may reduce the frequency of transmissions to the cloud. In order to ensure that end users are informed of potentially critical situations, the UT may be programmed to initiate a data transmission to the cloud, even during reduced power operations, if the sensor output reaches a preselected set point. Assume for example that a pressure of 1,500 psi in a particular system represents a dangerous condition (e.g., such a pressure reading would trigger an alarm at an operating station). If a UT in this system is operating in reduced power mode, it might be programmed to initiate a transmission to the cloud if the pressure reaches 1,500 psi. Similarly, the UT might be programmed to make other transmissions under such conditions.

The UT described above, for example, might be capable of Bluetooth communications with an automated relief valve. In the situation described in the preceding paragraph, the UT might be programmed to send an emergency signal via Bluetooth to the relief valve controller in order to open the relief valve. These operations might be programmed to override the normal reduced power operating limits.

The UT also should have the ability to self-monitor. This monitoring would include sensing internal UT temperature, battery levels, charging currents and operating currents, data processing speeds, and other key parameters. The results of this monitoring may be sent periodically to the cloud-based system, which can store this data in order to compile a thorough operating conditions log for the UT. The data in such a log may be useful for diagnosing problems or for evaluating the overall health of a particular UT.

It is important, however, not to overload the UT with unduly complex operations or data storage requirements. Ideally, the UT acts as a conduit. The UT receives sensor data, converts that data into a standardized type of digital data, and then sends that standardized data packet to the cloud. Most processing and data storage should occur at the cloud-level because of the much greater computing and storage capabilities of cloud-based systems. The UT is designed to complement a cloud-based system, by both sending data to the cloud and by performing data storage operations to ensure there are few gaps in the data received and stored by the cloud.

Some of the key functions of the cloud-based system 32 are shown in FIG. 6. The highest level system operations occur at the cloud level. This type of operation might include a shift to a new operating system or data standard. It might include access controls, such as limiting most end users to data-only connections, while providing greater control to particular users.

Interactive control management and display functions are also performed at the cloud level. Users who want to see different data send requests from their platforms 36 to the cloud-based system 32. These are two-way operations, with the cloud responding to such requests and providing different data or different displays to users. Requests for new or different sensors from users with proper authority are also handled at the cloud-level.

Information management is another operation conducted by the cloud-based system 32. How much data should be stored, and for how long? How frequently should data be sampled? Is the data reliable? Who should have access to the data? These are all information management questions, and these operations are performed at the cloud level by operators with proper authorization. The latter point involves another cloud-level operation: network management security, authentication, and traffic control.

The cloud-based system has data storage and management capabilities. Most of the data from the remote sensors is stored at the cloud level so that this data is available to many end users. The cloud-based system in a preferred embodiment has data management features that prioritize data and store the more recent and most significant data in storage configured for rapid access by end users. Older data that is less significant may be archived. The cloud-based system is configured to give end users the fastest access possible to the most critical data.

The cloud-based system communicates wirelessly with a plurality of UTs. These are two-way communications. Any of the means of wireless communications described above in connection with the UT 22 may be used by the cloud-based system, too. The cloud-based system may use wired communications (e.g., Ethernet, coaxial cable, etc.) for communicating with a transmitting station, while the signals between the transmitting station and the UTs may be wireless. Communications between the cloud-based system and end users may be wired or wireless. Many end users are expected to use wired Internet connections to access the cloud-based system, but wireless access is also possible and is expected to be used frequently, too.

Many data analysis operations may be conducted by the cloud-based system. These can be preprogrammed or configured upon receipt from an end user of a request for particular data or analysis. For example, the cloud-based system might generate pressure vs. temperature charts for a particular system using data from various remote UT/sensor combinations. Alternatively, a user might request a chart or curve showing the relationship of pressure vs. flow rate over a particular time period. The processor(s) of the cloud-based system may perform the necessary analysis to provide this type of tailored data to an end user. The programming needed to perform these types of operations is well-developed and within the knowledge of persons skilled in the art. These types of operations are currently performed by other cloud-based systems. The difference in the present invention, is the integration of these and other cloud-based operations, as well as how the cloud-based operations interface with the "smart" UTs that are paired to the remote sensors.

Finally, program control management is performed at the cloud level. This could include things as simple as initializing new UT/sensor combinations or checking the operating system of a UT. It might also include a move to a new API at any of the interfaces found in the system.

A number of operations described above are performed by the UT using an internal programmable processor and memory. Examples of such operations include the following:

- an initialization process comprising a systems check and communications check with a cloud-based operating system;
- a data storage and transmission process comprising storing data from the connected sensor, controller, or transmitter and transmitting at least some of that data to the cloud-based operating system;
- a low-power operating process comprising a selective decrease in operations that consumer relatively large amounts of stored energy and an increase in data storage until a low-power condition has ended;
- an application programming interface (API) update process comprising a change to the communications protocol applicable to transmissions between the universal translator and an intermediate stage receiver/transmitter station;
- an operating system update process comprising receipt of update instructions from the cloud-based operating system, storage of a new operating system in memory, testing of the new operating system, initialization and use of the new operating system, and deletion of a prior operating system; and,
- a data change process comprising data change instructions received from the cloud-based operating system and a resulting change in some aspect of the data stored and transmitted by the universal translator.

FIG. 6 shows some of the key operations an end user 38 might perform using an end user platform 36. The user 38 might interface with the system control function, though such actions would be strictly limited to those users with the proper authority. Most end users would lack authority to alter system-level operations. A typical end user, however, may be able to interface with the cloud to download an app or some other program for viewing remote sensor data.

Some users might have authority to request changes to the system, including new or replacement sensors. This would be done by interfacing with the cloud-based system 32. Some users would also interface with the network management and security functions, perhaps by providing unique log-in credentials via an end user platform 36. Most users would interface with the information and program storage functions of the cloud, because that function would be needed to provide the remote sensor data to the end user 38. Almost all the operations of an end user will be two-way, between an end user platform 36 and the cloud 32.

Figures 7, 8:
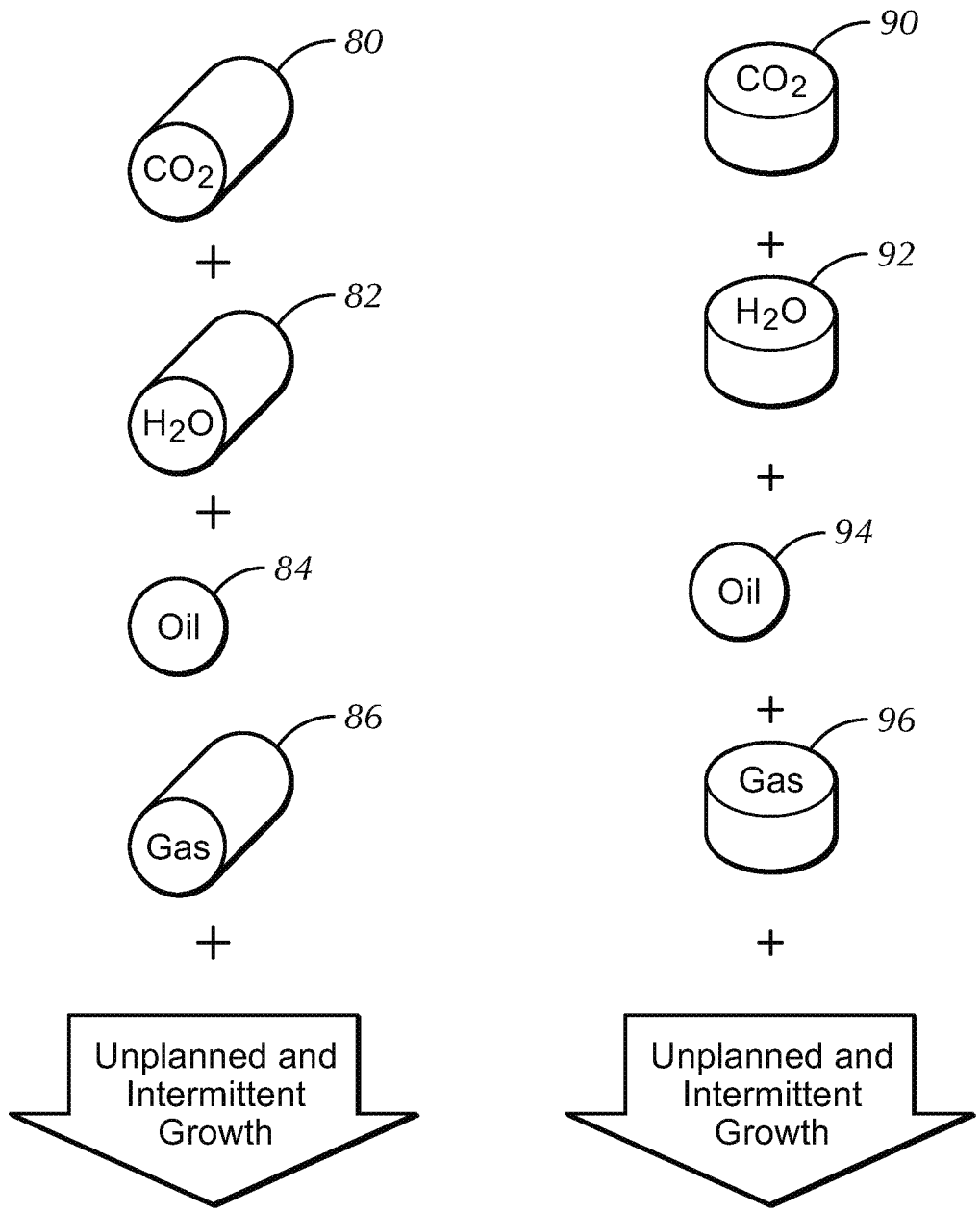
FIG. 7 is a functional block diagram showing how the invention may use sensors.
FIG. 8 is a functional block diagram illustrating memory storage of the configuration represented by FIG. 7.

FIGS. 7 and 8 show how data can be gathered from sensors using the present invention, while allowing room for future expansion. These figures graphically illustrate a possible use of sensors in an oil and gas setting. During drilling, it may be important to monitor for $CO_2$, $H_2O$, and natural gas, and for this reason, sensors for those purposes might be installed early in the operation. Though it may be hoped that oil will be discovered, there may be less need for an oil sensor during the early stages of operations. FIG. 7 shows the first three sensors installed, but no oil sensor. Similarly, FIG. 8 shows data storage from these sensors. The cylinder representing the uninstalled oil sensor is lighter than the cylinders for the other three sensors, denoting that there is no data stored about the presence of oil. Presumably, if the operation depicted here is successful, as some point an oil sensor would be installed.

Indeed, with the current invention, an oil sensor/UT combination could be prepared and paired with the cloud-based system. This combination could then be sent to the field, where it could be installed quickly and easily when it is needed. Once such an installation is done, data from the oil sensor would be available immediately, as explained above.

Figure 9:
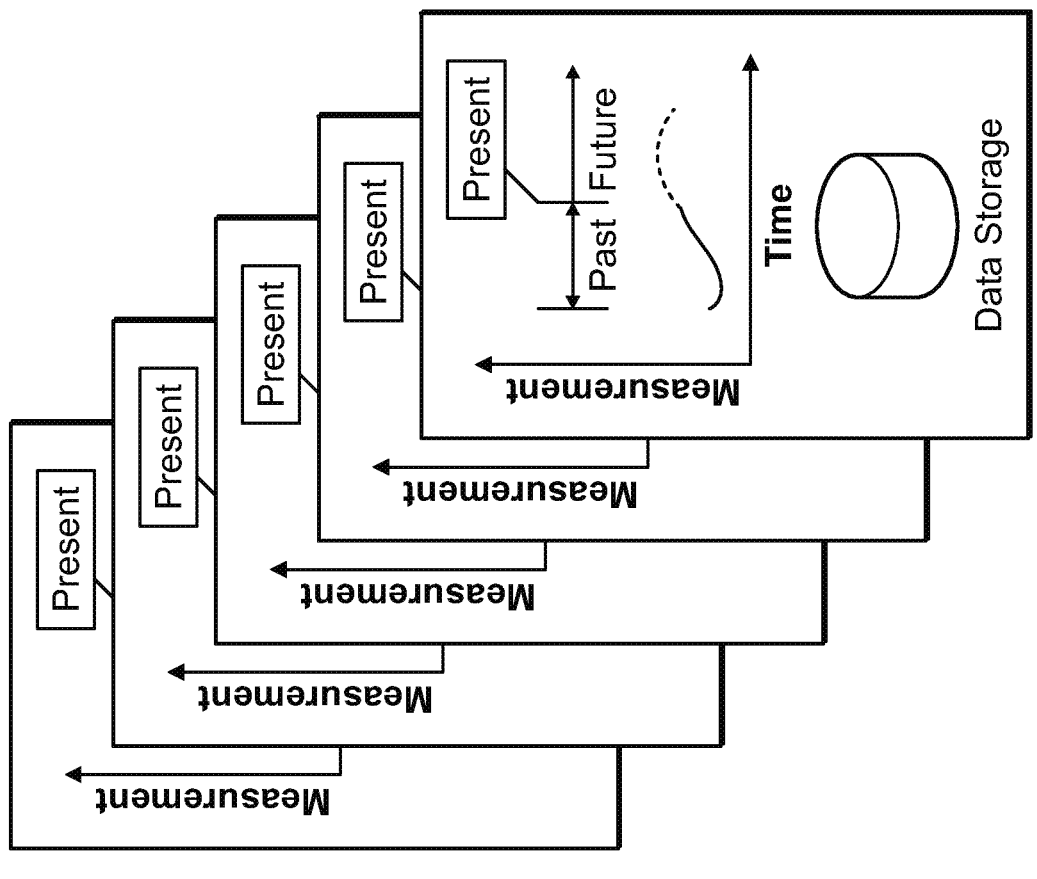
FIG. 9 represents data storage for a single sensor and for a system that uses multiple sensors.
Figure 9:
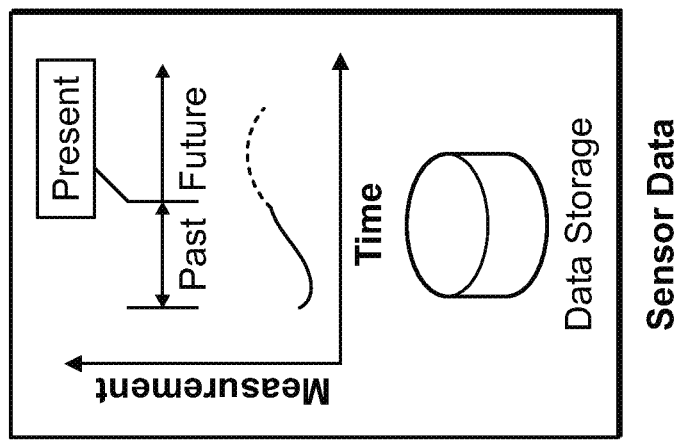
Figure 10:
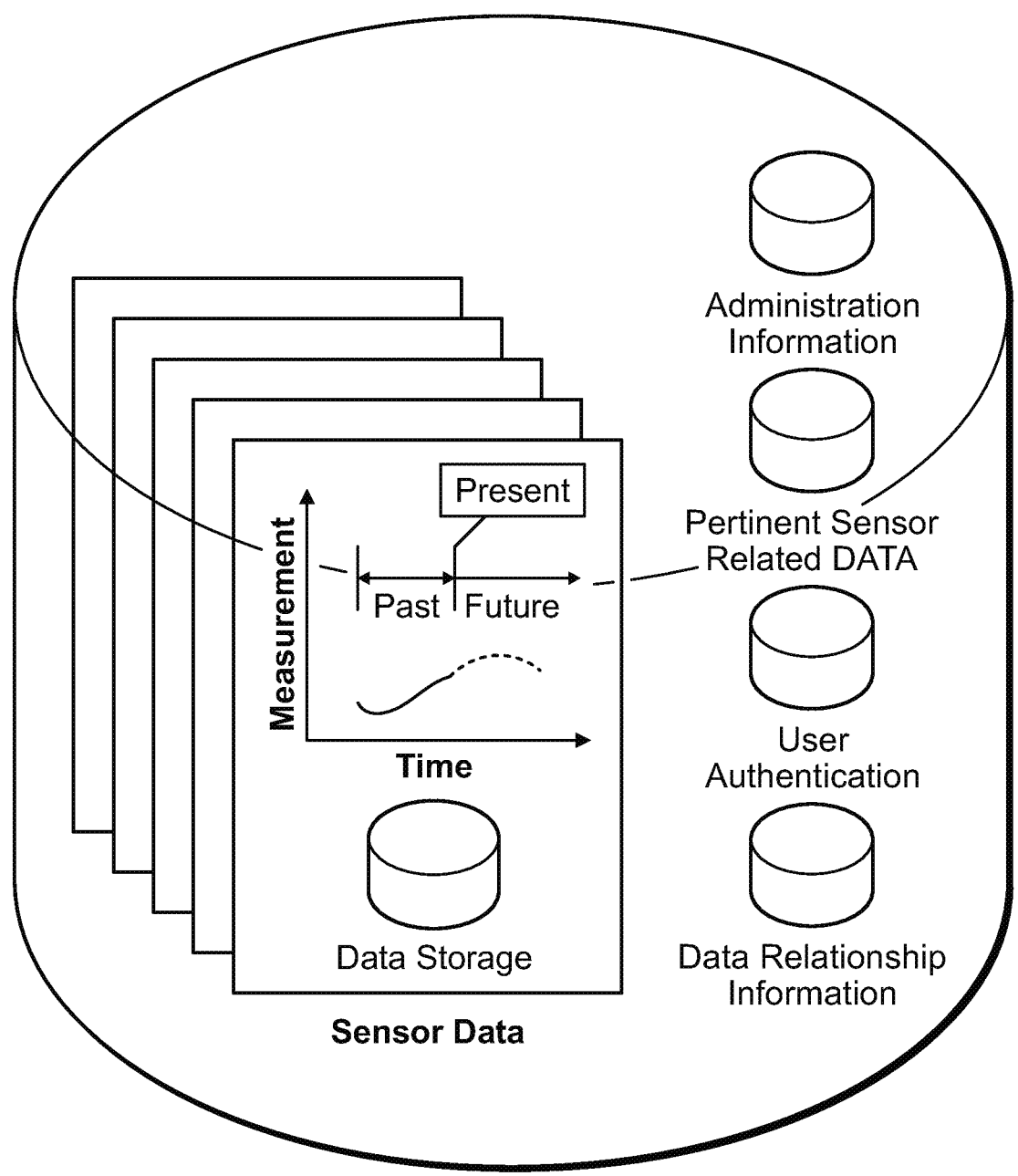
FIG. 10 is a functional representation of the cloud-based data storage aspect of a preferred embodiment of the present invention.

FIGS. 9 and 10 show graphically how data from one or multiple sensors may be stored by the present invention. FIG. 9 shows how data from a single sensor might be imagined. The cylinder represents the total amount of sensor data stored, while the curve represents the sensor data over time. All of this data would be stored in the cloud, and some of it might be stored in the UT, as well. The right-hand side of FIG. 9, however, shows data from several UT/sensor combinations. That data would be stored at the cloud level. No single UT/sensor combination would contain that sort of data.

FIG. 10 shows how the cloud-based system can store more than just the raw data from many UT/sensor combinations. In addition to the type of data illustrated by the right-hand side of FIG. 9, the cloud-based system could also perform analysis of the data and store the results of such analysis. The cloud-based system also would store user authentication data (e.g., passwords, authority levels), UT/sensor data (e.g., unique identifiers for each UT/sensor combination, sensor types, etc.), and various administrative information. The primary point made by FIG. 10 is that the key data, concerning all aspects of the system, is stored on the cloud.

Figure 11:
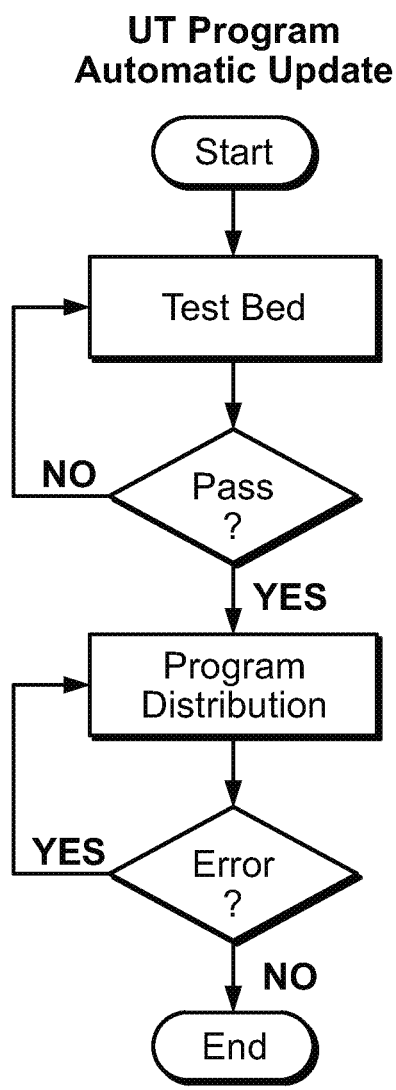
FIG. 11 is a flow chart for one operation of the present invention.

FIG. 11 is a flow chart showing one process for updating the operating software of a UT. The process begins at an end user's platform, where a test bed check is run. This check includes simulations of all critical steps of the process, including: program transfer from the cloud-based system to the UT; implementation of the new program by the UT; and, compatibility of the new program with the sensor or controller/transmitter. If this preliminary test bed process is not satisfactory, the new program is evaluated to determine and correct the problems. When the new program has successfully completed the test bed process on an end user's platform, the new program can be uploaded to the cloud.

Once the new program is stored on the cloud, the process may begin to replace the current UT operating program with the new program. It is important to ensure the UT continues to operate during this process, which means the current (i.e., old) operating program remains active during the transition process. The cloud sends a message to the UT indicating that a new operating system is to be loaded. This message also may contain basic information about the new program (e.g., size of the program). The UT confirms that this message is authentic and takes preparatory steps to ensure it is ready to receive the new program. This may require the UT to transfer data so that it has sufficient memory space for the new program. If the UT has stored data, it may communicate with the cloud to coordinate the transmission of such data before the new program is transferred. The UT also may run a systems check to ensure there are no anomalies before the program transfer. Once the UT has confirmed that it is ready to receive the new operating program, it sends a message to that effect to the cloud-based system.

The cloud-based system then transmits the new program, together with authentication and check-sum data, to the UT. The UT verifies the authenticity and completeness of the transfer. The UT also runs a check to ensure the new program was not corrupted. Other checks may be run by the UT on the new program. For example, the UT may run a test bed process on the new program to ensure the program produces the proper output.

Before the UT transitions to the new program, it may also set a timer interrupt. This setting would automatically terminate use of the new program after a set period of time (e.g., 60 seconds, five minutes, or some other appropriate time period) and transfer operations back to the old program. This would be done to ensure the new program is terminated if it operates improperly and cannot otherwise be terminated. If the new program operates properly, the timer interrupt would be disabled and the new program would continue to be used.

Once the appropriate checks have been satisfactorily completed and after the timer interrupt has been set, the UT would transition to the new program. This should be accomplished without causing any material interruption in the flow of data from the sensor. Once the new program is operating, the UT will monitor operations and send a report to the cloud. If the new program is operating properly, the timer interrupt (if one was used) will be disabled. The old program may then be deleted by the UT in order to maximize data storage space.

If there is some problem with the new program (e.g., if the timer interrupt is used to disable the new program), the UT will send complete reports to the cloud, which can be used to try to diagnose the problem with the program. This may include review of the problems by the end user and development of a new version of the program. This general process can be used as long as needed to get a satisfactory new operating program installed and operating on all UTs.

The current invention provides a new level of standardization, but it also allows for expansion in novel ways. For example, an end user can plan today a sensor based monitoring network that is going to take place in the future. The current invention allows for venders to see the request made by the end user. The venders can then bid and compete to prepare sensors, the installation plan, and appropriate software. All of these processes are possible through use of the present invention, and allow for many key steps of the network planning and development to occur in a decentralized manner that is not controlled by either the end user or any other central authority. The process is decentralized because the cloud-based system provides the information many parties need to participate in the planning, preparation, and building of the network. All of these steps mentioned above may occur before the first sensor is installed or the first part of the physical system is built. Indeed, the cloud-based system, the UT/sensor combinations, may all be ready-to-go by the time the physical system is built. Once the UT/sensor combinations are installed, the monitoring network is capable of immediately providing data to the cloud-based operating system and, thus, to all parties with access to that system.

For example, consider that an oil or natural gas drilling operation is planned. Assume, for example, that Company X obtained a lease to drill such a well at a particular site. The actual physical construction of the well might not begin for a few years after the lease is signed and the plans are set. Using the present invention, the remote sensor monitoring network can be designed and built in parallel with the physical construction of the drilling operation. By the time the physical drilling systems are built, the UT/sensor combinations will be ready for installation. And by the time such installation occurs, the cloud-based operating system is already up and running and ready to receive data from the UT/sensor combinations. The present invention allows this type of advanced preparation for future systems, and as a result, it reduces delay and provides a fully-operational data monitoring and control system that is ready-to-go before the physical system to be monitored is built.

The preceding description is provided to illustrate certain preferred embodiments of the present invention. This description is not limiting and persons with skill in the art will recognize the existence of other variations on the structures and methods described above. All such variations, to the extent they are consistent with the preceding description and the following claims, are intended to be within the scope of the invention set forth in this patent.

I claim:

1. A universal translator comprising:
   a. A housing;
   b. A lower end cap connected to a first end of the housing and having
      i. a means for mechanically and electrically connecting the universal translator to a sensor, controller, or transmitter; and,
      ii. a means for activating the universal translator;
   c. An upper end cap connected to a second end of the housing;
   d. A means for generating electrical energy located inside the housing;
   e. An electrical energy storage means located inside the housing and configured to receive electrical energy from the means for generating electrical energy;
   f. A means for wirelessly transmitting and receiving located inside the housing;
   g. Electronics located inside the housing, the electronics including a programmable processor and memory, wherein the electronics are configured:
      i. to receive signals from a sensor, controller, or transmitter that is connected to the universal translator;
      ii. to convert said signals into a standardized digital format;
      iii. to store said signals in accordance with operational factors;
      iv. to transmit said signals to a cloud-based operating system; and,
      v. to receive command and control signals from the cloud-based operating system; and
   h. a means of detecting a loss of power to the sensor, controller, or transmitter, and wherein the programmable processor is further configured to transmit a signal to the cloud-based operating signal when the universal translator detects a loss of power to the sensor, controller or transmitter.

2. The universal translator of claim 1 wherein the means for wirelessly transmitting and receiving located inside the housing includes a capability to transmit using Bluetooth technology.

3. The universal translator of claim 1 further comprising a means of transmitting signals through a wired connection.

4. The universal translator of claim 1, wherein the means for generating electrical energy located inside the housing is a solar cell.

5. The universal translator of claim 4, wherein the solar cell wraps around most of the outer, circumferential surface of the housing, but where the solar cell is covered by a protective outer shell that allows for the transmission of sunlight to the solar cell.

6. The universal translator of claim 1, wherein the means for wirelessly transmitting and receiving includes an internal antenna.

7. The universal translator of claim 1, wherein the programmable processor is preset for at least two different sensor types, including with associated data types, data reporting frequencies, and other data characteristics.

8. The universal translator of claim 1, wherein the programmable processor is configured to automatically detect the sensor type when the universal translator is connected to a sensor.

9. The universal translator of claim 1, wherein the electronics include a 16 bit or higher analog-to-digital converter for converting analog sensor data to digital signals.

10. The universal translator of claim 1, wherein the lower and upper end caps are weather-resistant.

11. The universal translator of claim 1, wherein the memory stores unique identification data from the following group: unique identifier of the universal translator, sensor type and model, geographic location, antenna and transmitter design, operating system version, and install date.

12. The universal translator of claim 1, wherein the programmable processor is capable of performing power management functions, program control management functions, information management functions, and network management functions.

13. The universal translator of claim 12, wherein the power management functions include monitoring power generation rate and power storage level.

14. A universal translator comprising:
  a. A housing;
  b. A lower end cap connected to a first end of the housing and having a means for connecting the universal translator to a sensor, controller, or transmitter;
  c. An upper end cap connected to a second end of the housing;
  d. A means for transmitting and receiving located inside the housing;
  e. Electronics located inside the housing, the electronics including a programmable processor and memory, wherein the programmable processor is capable of being configured to perform at least two of the following operations:
    i. an initialization process comprising a systems check and communications check with a cloud-based operating system;
    ii. a data storage and transmission process comprising storing data from the connected sensor, controller, or transmitter and transmitting at least some of that data to the cloud-based operating system;
    iii. a low-power operating process comprising a selective decrease in operations that consumer relatively large amounts of stored energy and an increase in data storage until a low-power condition has ended;
    iv. an application programming interface (API) update process comprising a change to the communications protocol applicable to transmissions between the universal translator and an intermediate stage receiver/transmitter station;
    v. an operating system update process comprising receipt of update instructions from the cloud-based operating system, storage of a new operating system in memory, testing of the new operating system, initialization and use of the new operating system, and deletion of a prior operating system;
    vi. a data change process comprising data change instructions received from the cloud-based operating system and a resulting change in some aspect of the data stored and transmitted by the universal translator; and
    vii. to detect a loss of the link between the universal translator and the cloud-based operating system, and wherein the programmable processor, upon detecting such a loss of the link between the universal translator and the cloud-based operating system, shifts to a data-preservation operating mode.

15. A universal translator comprising:
  a. A housing;
  b. A lower end cap connected to a first end of the housing and having
    i. a means for mechanically and electrically connecting the universal translator to a sensor, controller, or transmitter; and,
    ii. a means for activating the universal translator;
  c. An upper end cap connected to a second end of the housing;
  d. A means for generating electrical energy located inside the housing;
  e. An electrical energy storage means located inside the housing and configured to receive electrical energy from the means for generating electrical energy;
  f. A means for wirelessly transmitting and receiving located inside the housing;
  g. Electronics located inside the housing, the electronics including a programmable processor and memory, wherein the electronics are configured:
    i. to receive signals from a sensor, controller, or transmitter that is connected to the universal translator;
    ii. to convert said signals into a standardized digital format;
    iii. to store said signals in accordance with operational factors;
    iv. to transmit said signals to a cloud-based operating system;
    v. to receive command and control signals from the cloud-based operating system; and
    vi. to detect a loss of the link between the universal translator and the cloud-based operating system, and wherein the programmable processor, upon detecting such a loss of the link between the universal translator and the cloud-based operating system, shifts to a data-preservation operating mode.

16. The universal translator of claim 15 wherein the means for wirelessly transmitting and receiving located inside the housing includes a capability to transmit using Bluetooth technology.

17. The universal translator of claim 15 further comprising a means of transmitting signals through a wired connection.

18. The universal translator of claim 15, wherein the data-preservation mode includes prioritizing sensor data so that the most critical data is preserved until the link between the universal translator and the cloud-based operating system is restored.

19. The universal translator of claim 15, wherein the means for generating electrical energy located inside the housing is a solar cell.

20. The universal translator of claim 19, wherein the solar cell wraps around most of the outer, circumferential surface of the housing, but where the solar cell is covered by a protective outer shell that allows for the transmission of sunlight to the solar cell.

21. The universal translator of claim 15, wherein the means for wirelessly transmitting and receiving includes an internal antenna.

22. The universal translator of claim 15, wherein the programmable processor is preset for at least two different sensor types, including with associated data types, data reporting frequencies, and other data characteristics.

23. The universal translator of claim 15, wherein the programmable processor is configured to automatically detect the sensor type when the universal translator is connected to a sensor.

24. The universal translator of claim 15, wherein the electronics include a 16 bit or higher analog-to-digital converter for converting analog sensor data to digital signals.

25. The universal translator of claim 15, wherein the lower and upper end caps are weather-resistant.

26. The universal translator of claim 15, wherein the memory stores unique identification data from the following group: unique identifier of the universal translator, sensor type and model, geographic location, antenna and transmitter design, operating system version, and install date.

27. The universal translator of claim 15, wherein the programmable processor is capable of performing power management functions, program control management functions, information management functions, and network management functions.

28. The universal translator of claim 27, wherein the power management functions include monitoring power generation rate and power storage level.

\* \* \* \* \*